(12) United States Patent
Lee et al.

(10) Patent No.: US 8,631,567 B2
(45) Date of Patent: Jan. 21, 2014

(54) METHOD OF MANUFACTURING RIGID-FLEXIBLE PRINTED CIRCUIT BOARD

(75) Inventors: Yang Je Lee, Chungcheongbuk-do (KR); Il Woon Shin, Busan (KR); Going Sik Kim, Chungcheongbuk-do (KR); Doo Pyo Hong, Chungcheongnam-do (KR); Ha Il Kim, Seoul (KR); Dong Gi An, Gyeongsangnam-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 986 days.

(21) Appl. No.: 12/719,618

(22) Filed: Mar. 8, 2010

(65) Prior Publication Data

US 2010/0162562 A1 Jul. 1, 2010

Related U.S. Application Data

(62) Division of application No. 11/708,456, filed on Feb. 21, 2007, now abandoned.

(30) Foreign Application Priority Data

Jul. 13, 2006 (KR) .......................... 10-2006-0065847

(51) Int. Cl.
*H05K 3/02* (2006.01)
*H05K 3/10* (2006.01)

(52) U.S. Cl.
USPC ............... 29/846; 29/830; 29/831; 29/848; 29/854; 29/855; 156/184; 156/289; 174/254; 361/742; 361/748; 361/751; 361/804; 439/595; 439/637

(58) Field of Classification Search
USPC .......... 29/825, 830, 831, 846–848, 851, 855, 29/858; 156/184, 289; 174/254; 361/742, 361/748–751, 804; 439/595, 637
See application file for complete search history.

(56) References Cited

U.S. PATENT DOCUMENTS 3,409,732 A 11/1968 Dahlgren et al.
4,338,149 A 7/1982 Quaschner
(Continued)

FOREIGN PATENT DOCUMENTS

CN 1141570 1/1997

OTHER PUBLICATIONS

Restriction Requirement mailed Jul. 17, 2008; U.S. Appl. No. 11/708,456.
Office Action mailed Dec. 1, 2008; U.S. Appl. No. 11/708,456.
Final Office Action mailed Jun. 11, 2009; U.S. Appl. No. 11/708,456.
Office Action mailed Nov. 24, 2009; U.S. Appl. No. 11/708,456.

*Primary Examiner* — Paul D Kim

(57) ABSTRACT

A method of manufacturing a rigid-flexible printed circuit board, including providing a base substrate in which coverlays are respectively formed on two sides of a flexible copper foil laminate on both sides of which inner circuit patterns are respectively formed; layering insulation layers and copper foil layers on portions of coverlays which are to be a rigid region of the flexible copper foil laminate; forming a via hole in the rigid region, and, simultaneously, forming first windows in the coverlays in a flexible region; forming outer circuit patterns including areas adjacent to the first windows; and applying solder resist in the rigid region to expose portions of the external circuit patterns, where the outer circuit patterns formed in the areas adjacent to the first windows include additional plating portions for covering portions of the coverlays.

5 Claims, 22 Drawing Sheets

(56) References Cited

U.S. PATENT DOCUMENTS

| | | |
|---|---|---|
| 4,800,461 A | 1/1989 | Dixon et al. |
| 5,616,888 A | 4/1997 | McLaughlin et al. |
| 6,884,944 B1 | 4/2005 | Kuwako |
| 7,082,679 B2 * | 8/2006 | Myoung et al. ............... 29/830 |
| 7,312,401 B2 | 12/2007 | Tsukada et al. |
| 7,453,045 B2 * | 11/2008 | Myoung et al. ............. 174/254 |
| 8,101,266 B2 * | 1/2012 | Lee et al. ...................... 428/209 |
| 8,366,903 B2 * | 2/2013 | Kawamura et al. .......... 205/674 |

* cited by examiner

FIG.1A – Prior Art
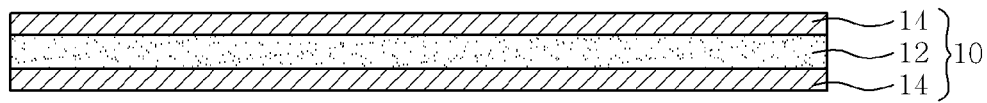
FIG.1B – Prior Art
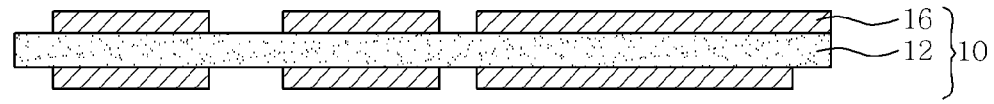
FIG.1C – Prior Art
FIG.1D – Prior Art
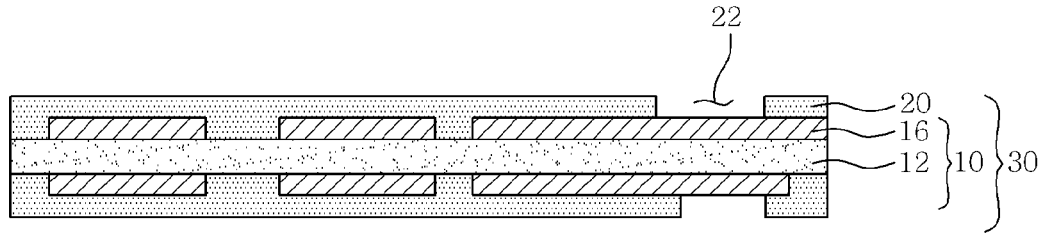

FIG.1E – Prior Art
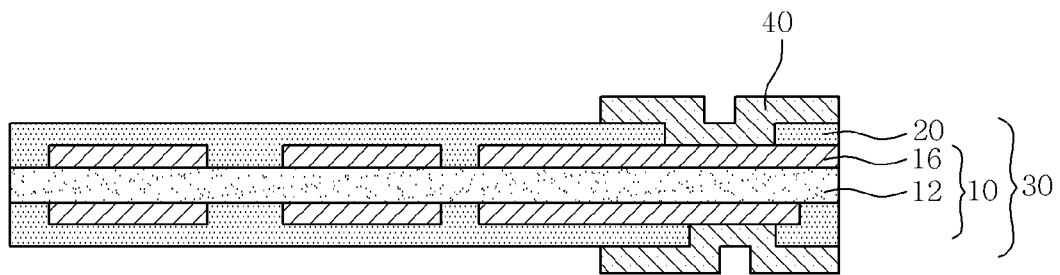
FIG.1F – Prior Art
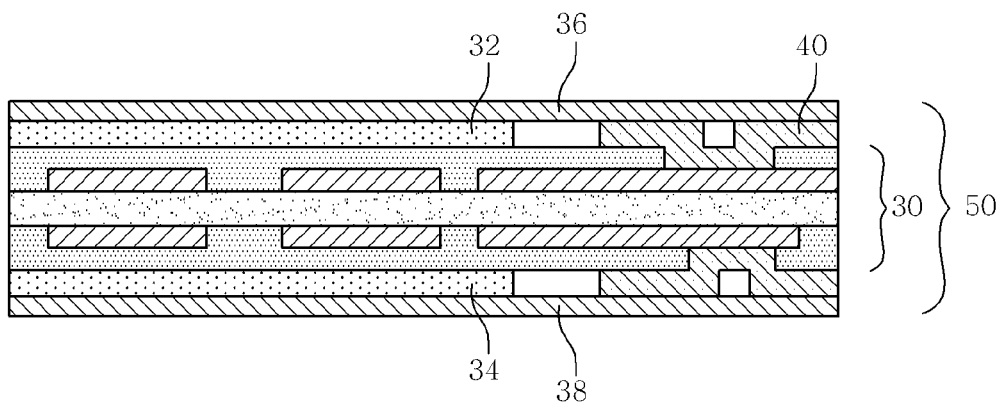
FIG.1G – Prior Art
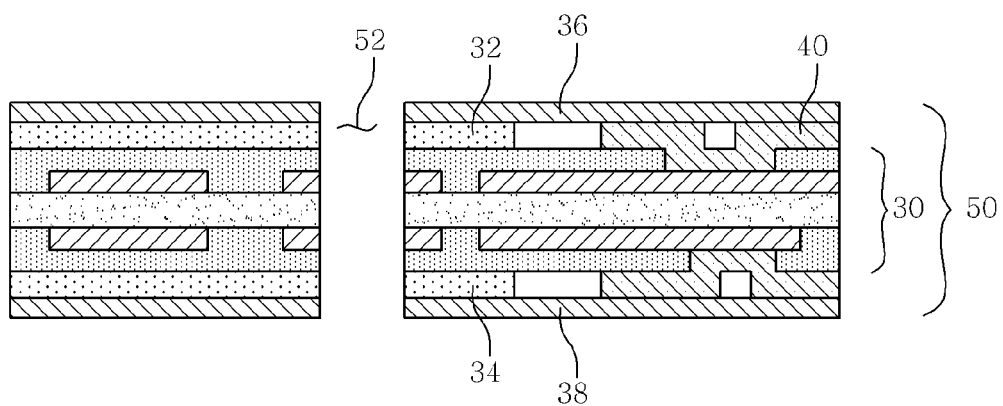

FIG.1H – Prior Art
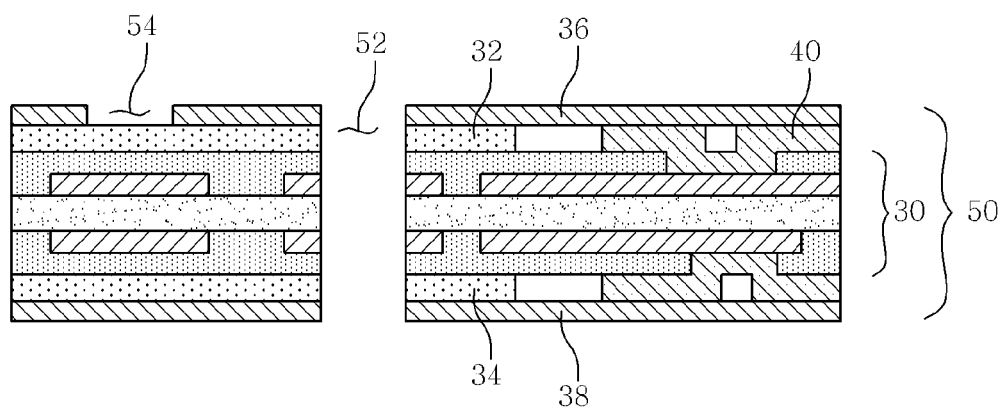
FIG.1I – Prior Art
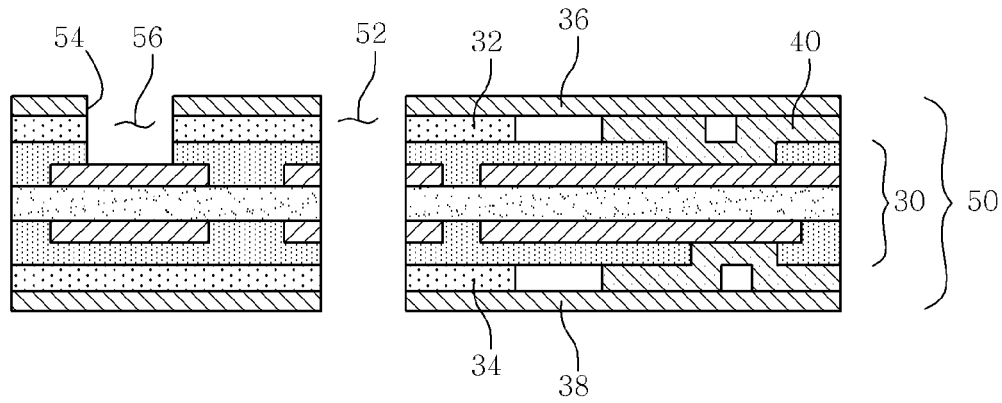

FIG.1J – Prior Art
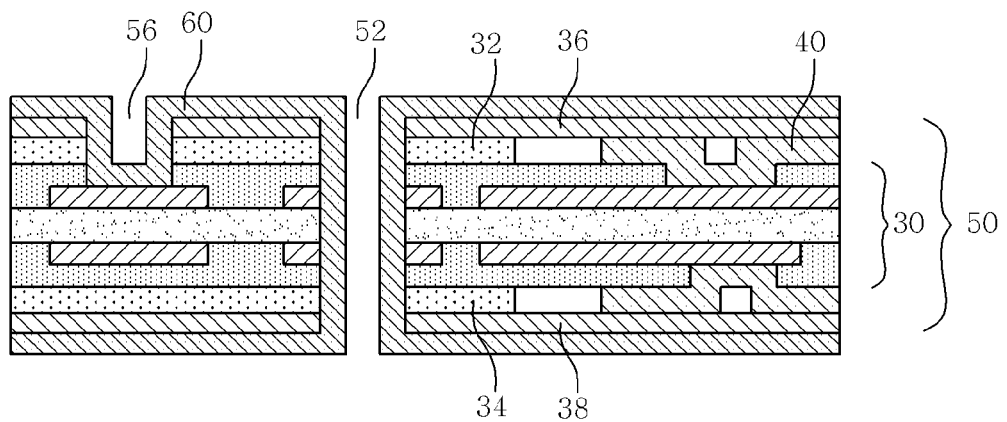
FIG.1K – Prior Art
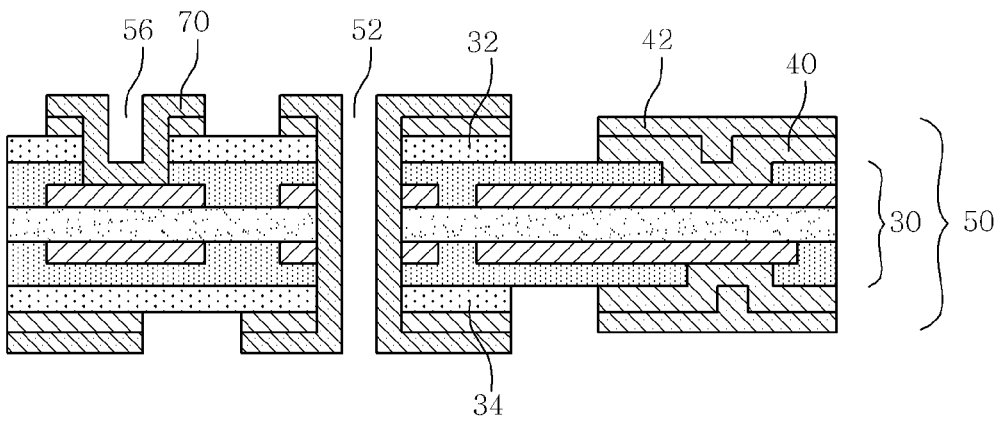

FIG.1L – Prior Art
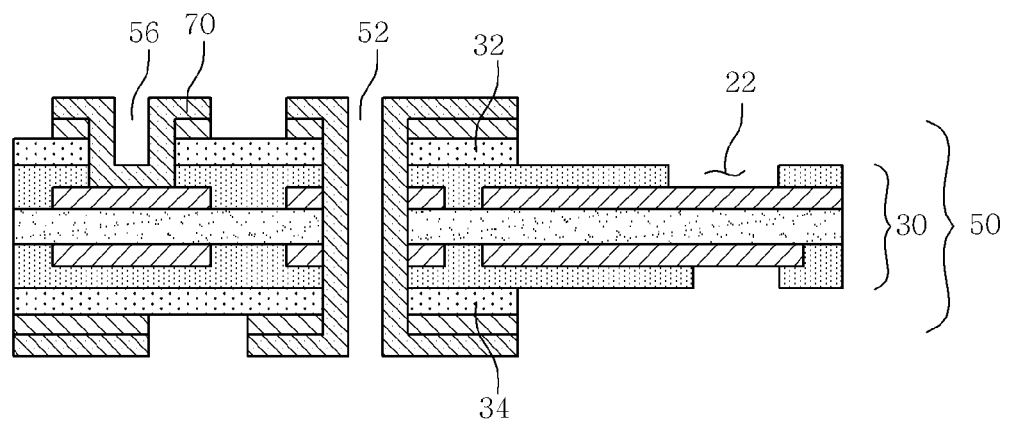
FIG.1M – Prior Art
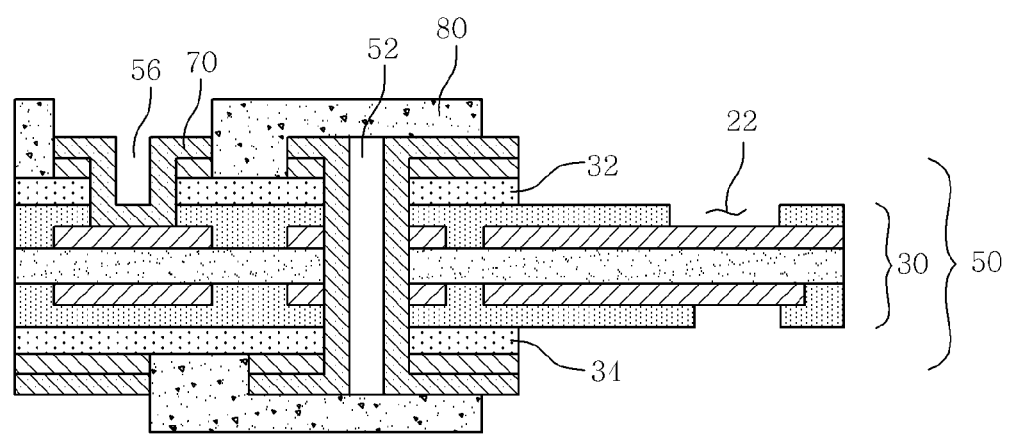

FIG.1N – Prior Art
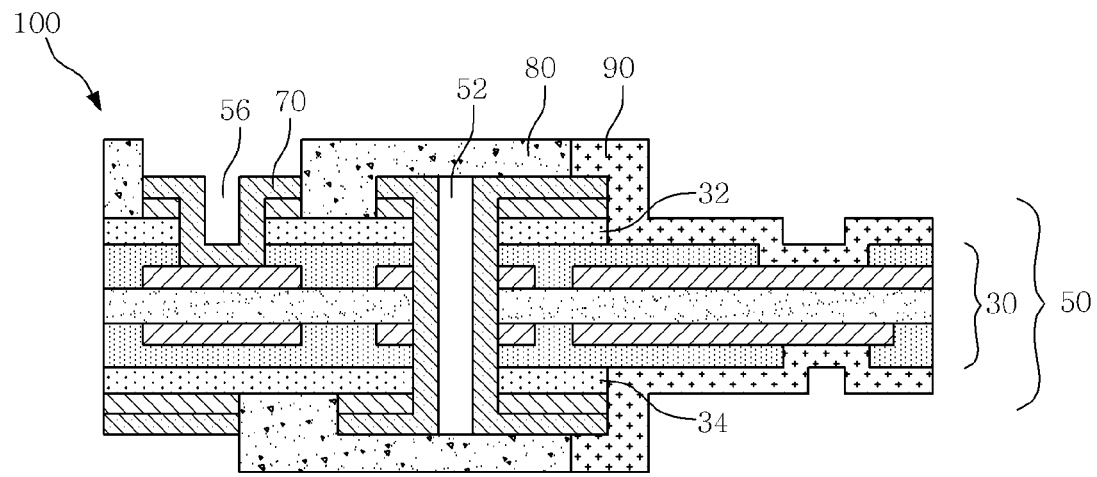
FIG.2
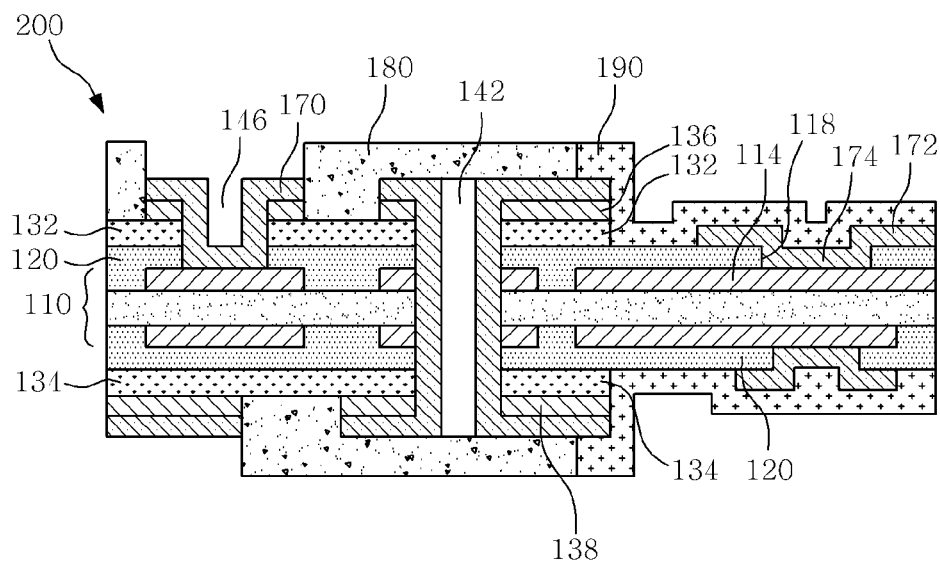

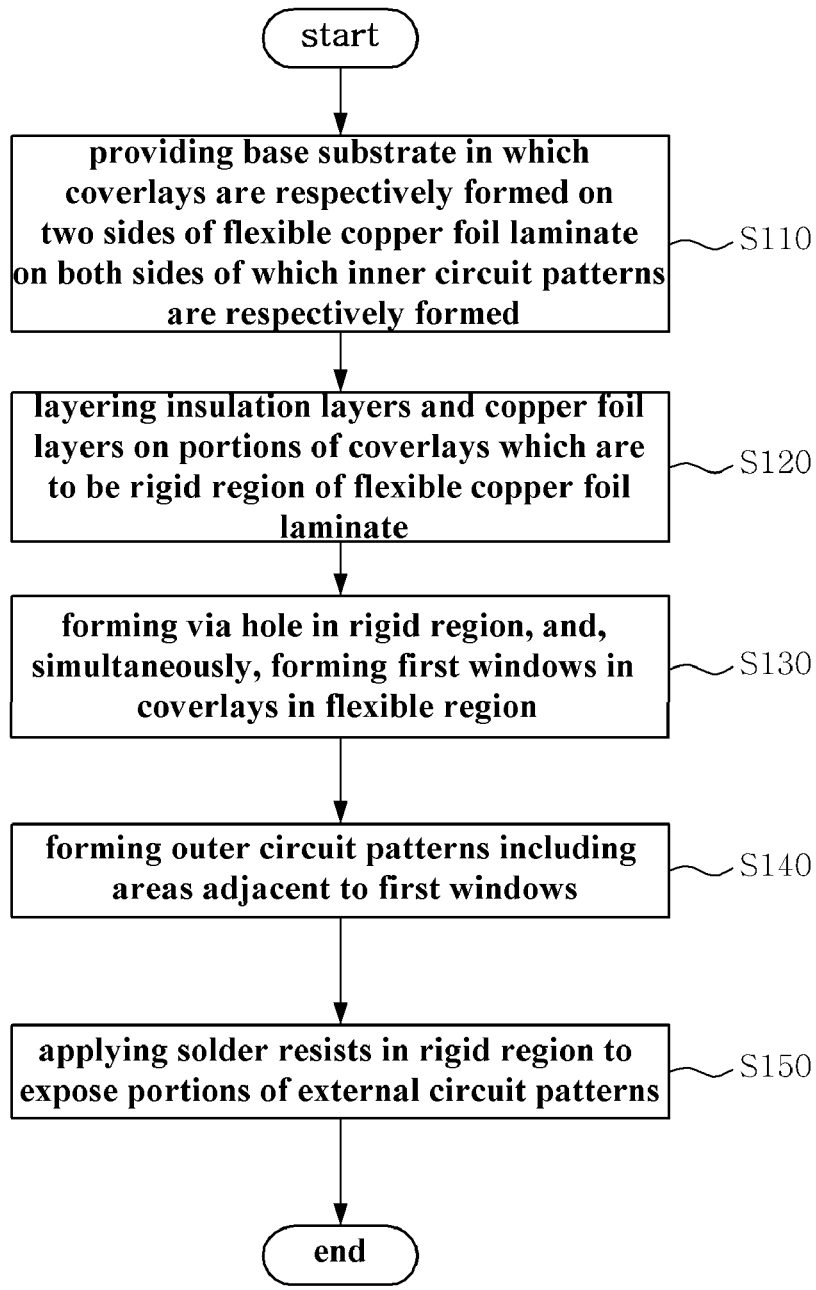

METHOD OF MANUFACTURING RIGID-FLEXIBLE PRINTED CIRCUIT BOARD

CROSS-REFERENCE TO RELATED APPLICATIONS

This application is a divisional and claims priority to U.S. application Ser. No. 11/708,456, filed Feb. 21, 2007, now abandoned, which in turn claims the benefit of Korean Patent Application 10-2006-0065847 filed with the Korean Intellectual Property Office on Jul. 13, 2006, the disclosures of which are incorporated herein by reference in their entirety.

BACKGROUND

1. Field

The present invention relates to a method of manufacturing a rigid-flexible printed circuit board and, more particularly, to a method of manufacturing a rigid-flexible printed circuit board including CL via holes which can facilitate electrical connection to an inner circuit pattern in a flexible region.

2. Description of the Related Art

Generally, a rigid-flexible printed circuit board is formed by structurally combining a rigid substrate, which is made of a rigid material, with a film type flexible substrate, which can be easily bent. In the rigid-flexible printed circuit board, the rigid substrate is connected with the flexible substrate without an additional connector.

To meet the recent trend toward miniaturized, light, and slim devices, electronic devices, such as mobile phones, Personal Digital Assistants (PDAs) and digital cameras, require design technology for optimizing the mounting space for electronic parts as well as fine processing technology for miniaturizing the electronic parts to be mounted. Particularly, it is required to provide a printed circuit board capable of mounting highly integrated electronic parts at high density.

FIGS. 1A to 1N are process diagrams showing a conventional method of manufacturing a rigid-flexible printed circuit board. The conventional method of manufacturing a rigid-flexible printed circuit board will be described with reference to FIGS. 1A to 1N below.

As shown in FIG. 1A, a double-sided Flexible Copper Clad Laminate (FCCL) 10 with an insulation layer 12 and copper foil layers 14 respectively formed on two sides of the insulation layer 12 is provided, and, as shown in FIG. 1B, predetermined inner circuit patterns 16 are respectively formed on the two sides of the insulation layer 12 using the copper foil layers 14.

As shown in FIG. 1C, before coverlays 20 are respectively layered on two sides of the double-sided FCCL 10, first windows 22 are respectively formed in the portions of coverlays 20 corresponding to a flexible region.

Then, as shown in FIG. 1D, a base substrate 30 is formed by respectively layering the coverlays 20, in which the first windows 22 are respectively formed, on the two sides of the double-sided FCCL 10 to conform to the inner circuit patterns (not shown) formed on the two sides of the double-sided FCCL 10.

As shown in FIG. 1E, since the portions of the copper foil layers 14 of the double-sided FCCL 10 corresponding to the first windows are open and are then etched through a subsequent etching process, resists 40 are formed to protect the open portions of the copper foil layers 14.

As shown in FIG. 1F, a rigid region is formed by respectively layering insulation layers 32 and 34 on two sides of the remainder of the base substrate 30 other than the portion of the base substrate 30 including the region in which the resists 40 are formed, and a laminated body 50 is formed by respectively layering copper foil layers 36 and 38, having the same size as the base substrate 30, on the insulation layers 32 and 34.

Here, the portion of the base substrate 30 including the resists 40 forms a flexible region.

As shown in FIG. 1G, a Plated Through Hole (PTH) 52 for connecting the upper copper foil layer 36 and lower copper foil layer 38 in the rigid region is formed using a drilling machine, and, as shown in FIG. 1H, a second window 54 is formed in the outermost copper foil layer 36 of the rigid region.

As shown in FIG. 1I, a blind via hole 56 is formed in the rigid region to correspond to the second window 54, and, as shown in FIG. 1J, a plating layer 60 is formed throughout the laminated body 50.

As shown in FIG. 1K, outer circuit patterns 70 are formed by partially removing the plating layer, additional resists 42 are formed to a predetermined thickness in order to remove the resists 40 formed in the first windows, and, as shown in FIG. 1L, the resists 40 and 42 are then removed.

As shown in FIG. 1M, solder resists 80 are formed on the outer circuit patterns 70 to expose portions of the outer circuit patterns, and, as shown in FIG. 1N, the rigid-flexible printed circuit board is completed by applying conductive paste 90 to form ground shield layers on the outer sides of the flexible region.

However, since, in the conventional rigid-flexible printed circuit board, the windows are formed in the coverlays through previous processing, there have been problems in that manufacturing cost is high, and the process of layering the coverlays on the double-sided FCCL in to conform to the inner circuit patterns respectively formed on the two sides of the double-sided FCCL is difficult, and thus the cost of performing the processing is high.

Further, there have been problems in that the cost of applying and removing the resists is high, and defects may occur because residual resist is present on the circuit pattern after removal of the resists.

SUMMARY

Accordingly, the present invention has been made to solve the above problems occurring in the prior art, and an object of the present invention is to provide a rigid-flexible printed circuit board and a method of manufacturing the same, in which coverlays are layered on the entire surface of a double-sided FCCL without previous processing thereof, via holes are formed in the coverlays while a drilling process is performed to form the via holes, and then copper plating is performed over the entire surface thereof, thereby eliminating the cost of previously processing the coverlays, easily performing a process of provisionally layering the coverlays on the double-sided FCCL, and decreasing the cost thereof.

Another object of the present invention is to provide a rigid-flexible printed circuit board and a method of manufacturing the same, in which resists are not used, thereby decreasing the cost of applying and removing the resists, and preventing defects from occurring because residual resist does not remain after removing the resist.

In order to accomplish the above object, the present invention provides a rigid-flexible printed circuit board including a rigid region and a flexible region, wherein the flexible region includes at least one double-sided flexible copper foil laminate, coverlays respectively layered on copper foil layers of the flexible copper foil laminate and provided with windows having predetermined diameters, and plating layers respectively formed on walls of the windows, the plating layers comprising additional plating portions that have diameters larger than predetermined diameters of the windows and are formed on portions of the coverlays adjacent to the windows.

In the rigid-flexible printed circuit board, a blind via hole having a diameter smaller than the predetermined diameter of each of the windows is formed in the flexible region to correspond to each of the windows.

In the rigid-flexible printed circuit board, an inner via hole which has a diameter smaller than the predetermined diameter of each of the windows and through which the upper and lower portion of the flexible copper foil laminate are electrically connected is formed in the flexible region to correspond to each of the windows.

In the rigid-flexible printed circuit board, the least one flexible copper foil laminate is at least two flexible copper coil laminates layered in the flexible region, and the windows are formed in outermost copper foil layers of the layered flexible copper foil laminates.

Further, according to a first embodiment of the present invention, a method of manufacturing a rigid-flexible printed circuit board includes the steps of: (A) providing a base substrate in which coverlays are respectively formed on two sides of a flexible copper foil laminate, on both sides of which respective inner circuit patterns are formed; (B) layering insulation layers and copper foil layers on the portions of coverlays which are to be a rigid region of the flexible copper foil laminate; (C) forming a via hole in the rigid region, and simultaneously forming first windows in the coverlays in a flexible region; (D) forming outer circuit patterns including areas adjacent to the first windows; and (E) applying solder resists in the rigid region to expose portions of the external circuit patterns, wherein the outer circuit patterns in the region adjacent to the first windows include additional plating portions for covering the coverlays.

In the method, the via hole formed in the rigid region and the first windows formed in the flexible region are formed using a $CO_2$ laser at step (C).

The method further includes, after step (B), the steps of (B-1) forming a plated through hole in the rigid region through a drilling process; and (B-2) forming a second window in a copper foil in the rigid region.

In the method, a via hole is formed in the rigid region to correspond to the second window.

The method further includes, after the step (E), step (E-1) of applying conductive paste to form ground shield layers on the surface of the flexible region.

Further, according to a second embodiment of the present invention, a method of manufacturing a rigid-flexible printed circuit board includes the steps of (A) providing a base substrate in which coverlays are respectively formed on two sides of a flexible copper foil laminate, on both sides of which inner circuit patterns and a first window are respectively formed; (B) layering insulation layers and copper foil layers on the portions of coverlays which are to be a rigid region of the flexible copper foil laminate; (C) forming a via hole in the rigid region, and simultaneously forming a via hole to correspond to the first window in a flexible region; (D) forming outer circuit patterns including areas adjacent to the first window; and (E) applying solder resists in the rigid region to expose portions of external circuit patterns, wherein the region adjacent to the via holes in the flexible region includes additional plating portions for covering the coverlays.

Further, according to a third embodiment of the present invention, a method of manufacturing a rigid-flexible printed circuit board includes the steps of (A) providing a base substrate in which coverlays are respectively formed on two sides of a flexible copper foil laminate, on both sides of which inner circuit patterns are respectively formed; (B) layering insulation layers and copper foil layers on the portions of coverlays which are to be a rigid region of the flexible copper foil laminate; (C) forming a via hole in the rigid region, and simultaneously forming a via hole in one spot of a flexible region; (D) forming outer circuit patterns including areas adjacent to the via holes; and (E) applying solder resists in the rigid region to expose portions of the external circuit patterns, wherein the region adjacent to the via holes in the flexible region includes additional plating portions for covering the coverlays.

In the method, the via hole formed in the rigid region and the via hole formed in the flexible region are formed using an ultraviolet laser at step (C).

BRIEF DESCRIPTION OF THE DRAWINGS

The above and other objects, features and advantages of the present invention will be more clearly understood from the following detailed description taken in conjunction with the accompanying drawings, in which:

FIGS. 1A to 1N are process diagrams showing a conventional method of manufacturing a rigid-flexible printed circuit board;

FIG. 2 is a sectional view showing a rigid-flexible printed circuit board according to an embodiment of the present invention;

FIG. 3 is a flow chart schematically showing a method of manufacturing a rigid-flexible printed circuit board according to a first embodiment of the present invention;

DETAILED DESCRIPTION OF THE EMBODIMENTS

Figure 4A:
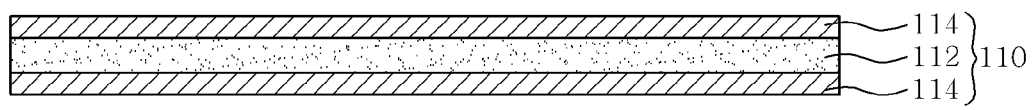
FIG. 4A to 4K are process diagrams sequentially showing the method of manufacturing the rigid-flexible printed circuit board in FIG. 3.

Preferred embodiments will be described with reference to the accompanying drawings below.

FIG. 2 is a sectional view showing a rigid-flexible printed circuit board according to an embodiment of the present invention.

The rigid-flexible printed circuit board 200 includes a rigid region and a flexible region.

The rigid region is formed in a predetermined region of a double-sided FCCL. The rigid region includes a double-sided FCCL 110 in which inner circuit patterns 114 are formed on both sides thereof, coverlays 120 and insulation layers 132 and 134 layered on two sides of the double sided FCCL 110, a plated blind via hole 146 formed in the insulation layer 132 and the upper coverlay 120 and a PTH 142 configured to electrically connect the upper and lower portions of a plating layer 160, copper foil layers 136 and 138 interposed between the insulation layers 132 and 134 and the plating layer 160, outer circuit patterns 170 formed on the insulation layers 132 and 134 using the plating layer 160 and the copper foil layers 136 and 138, and solder resists 180 formed to expose portions of the outer circuit patterns 170.

The flexible region is formed in the region of the double-sided FCCL 110 other than the rigid region of the double-sided FCCL 110. The flexible region includes the double-sided FCCL 110 in which the inner circuit patterns 114 are formed on both sides of the double-sided FCCL 110, the coverlays 120 respectively layered on two sides of the double-sided FCCL 110 and respectively provided with first windows 118 having predetermined diameters, plating layers 174 respectively formed in the first windows 118, and conductive paste 190 applied on the outer sides of the flexible region to form ground shield layers.

Further, the flexible region further includes additional plating layer portions 172, having diameters respectively larger than the diameters of the first windows, on the portions of the coverlays 120 adjacent to the first windows 118. Each of the additional plating layers 172 extends from the plating layer 174 formed in each of the first windows 118, and is a portion of the plating layer 160 formed on the entire surface of the laminated body 140 to form the outer circuit patterns 170.

Further, a multi-layered flexible substrate may be formed by layering two or more double-sided FCCLs in the flexible region, and the first windows 118 are formed in the outermost copper foil layers of the double-sided FCCLs.

Further, a blind via hole (see 248 and 348 in FIGS. 6 to 8) or an inner via hole (see 250 and 350 in FIGS. 6 to 8) having a diameter smaller than the predetermined diameter may be formed in the flexible region to correspond to the plated first window 118 having a predetermined diameter. The additional plating portion (see 272 and 372 in FIGS. 6 to 8) may also be formed on the coverlays adjacent to this via hole, and this via hole is referred to as a CL via hole.

Since this additional plating portion is provided, it is possible to increase the adhesive force between the coverlay and the plating layer.

FIG. 3 is a flow chart schematically showing a method of manufacturing a rigid-flexible printed circuit board according to a first embodiment of the present invention.

The method of manufacturing a rigid-flexible printed circuit board according to the first embodiment of the present invention is performed through the following steps.

First, a base substrate, in which coverlays are formed over two sides of a double-sided FCCL on both sides of which inner circuit patterns are formed, is provided (S110). Insulation layers and copper foil layers are layered on the portions of coverlays which are to be a rigid region of the double-sided FCCL (S120). A via hole is formed in the rigid region using a $CO_2$ laser, and simultaneously first windows are formed in the coverlays of the flexible region (S130).

An entire plating layer is formed over the entire area, and outer circuit patterns including a region around the first window are formed from the plating layer (S140). Then, solder resists are applied in the rigid region to expose a portion of the outer circuit patterns (S150).

Accordingly, it is possible to manufacture a rigid-flexible printed circuit board having additional plating portions in accordance with features of the present invention.

FIG. 4A to 4K are process diagrams sequentially showing the method of manufacturing the rigid-flexible printed circuit board in FIG. 3.

Figure 4B:
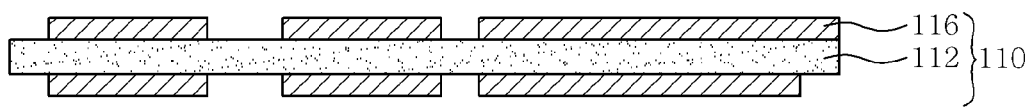

As shown in FIG. 4A, a double-sided FCCL 110, in which copper foil layers 114 are respectively formed on two sides of a polyimide film 112, is provided, and, as shown in FIG. 4B, predetermined inner circuit patterns 116 are respectively formed on both sides of the polyimide film 112 using the copper foil layers 14.

Figure 4C:
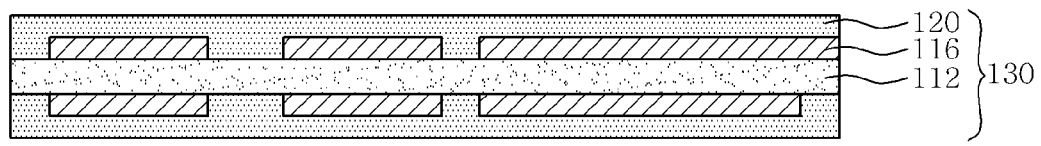

As shown in FIG. 4C, a base substrate 130 is formed by layering coverlays 120 respectively throughout two sides of the double-sided FCCL 110 on which the inner circuit patterns are formed.

Here, before the coverlays are respectively layered on the double-sided FCCL, windows are not formed in the regions of the coverlays corresponding to the flexible region by previous processing, and the coverlays are directly layered on the entire surfaces of the double-sided FCCL, therefore it is not necessary to perform a process of provisionally layering the coverlays on the double-sided FCCL to conform to the circuit patterns formed on the double-sided FCCL.

Figure 4D:
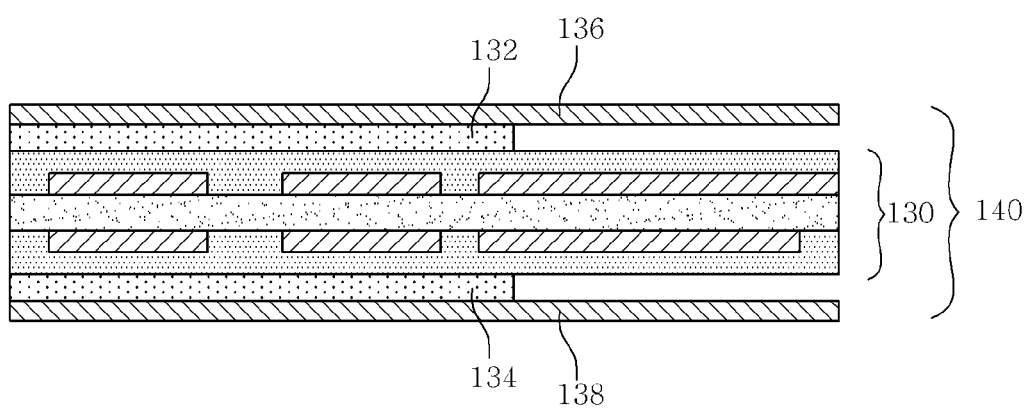

As shown in FIG. 4D, after the base substrate 130 is formed, insulation layers 132 and 134 are respectively layered on the portions of the coverlays 120 which are to be a rigid region in the base substrate 130, and copper foil layers 136 and 138 having a size corresponding to that of the base substrate 130 are respectively layered over the insulation layers 132 and 134, thereby forming a laminated body 140.

Here, a prepreg, which is a mixed material of reinforcing base material and resin and is cured after it is heated and pressurized in a semi-cured state, may be used as each of the insulation layers 132 and 134.

Figure 4E:
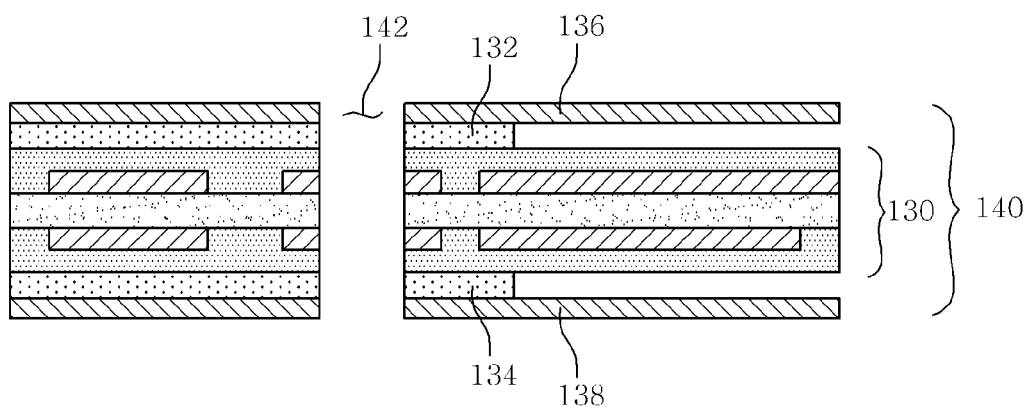
Figure 4F:
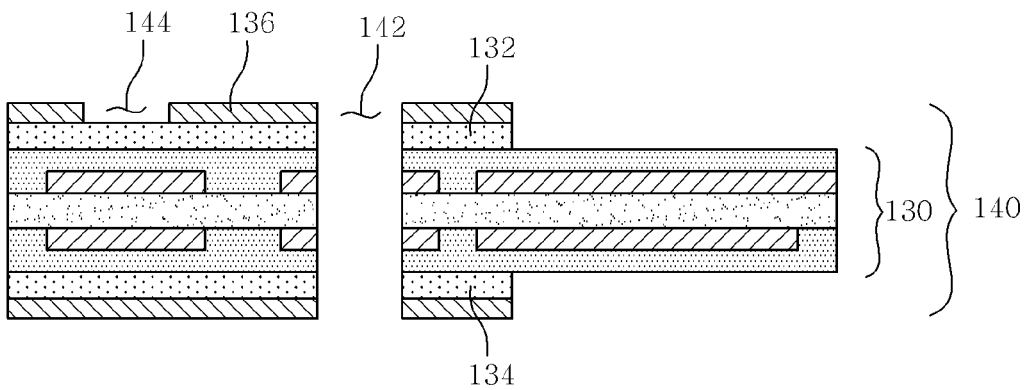

As shown in FIG. 4E, a PTH 142 for electrically connecting the upper and lower portions of the laminated body 140 is formed in the rigid region of the laminated body 140 through a drilling process, and, as shown in FIG. 4F, a second window 144 is formed in a portion of the copper foil layer 136 of the rigid region, and portions of the copper foil layers 136 and 138 of the flexible region are simultaneously removed.

Figure 4G:
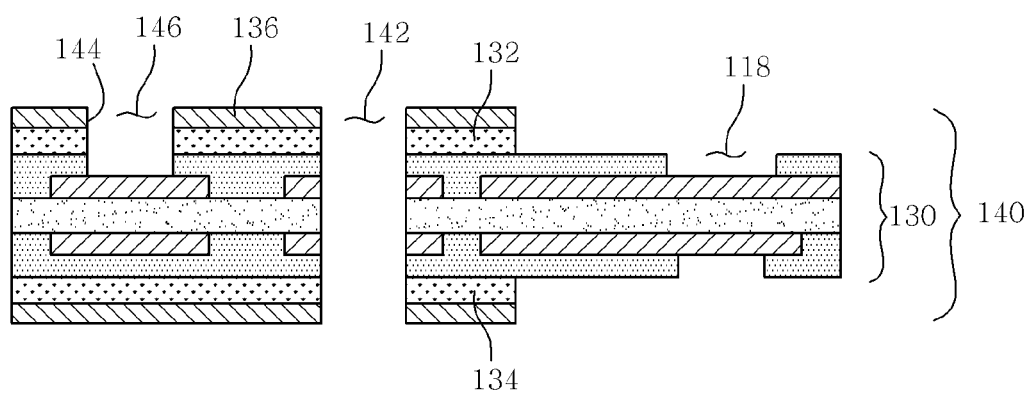

As shown in FIG. 4G, a blind via hole 146 is formed in the portion of the rigid region corresponding to the second window 144 using a $CO_2$ laser, and first windows 118 are simultaneously formed in portions of the coverlays 120 in the flexible region using the $CO_2$ laser.

Figure 4H:
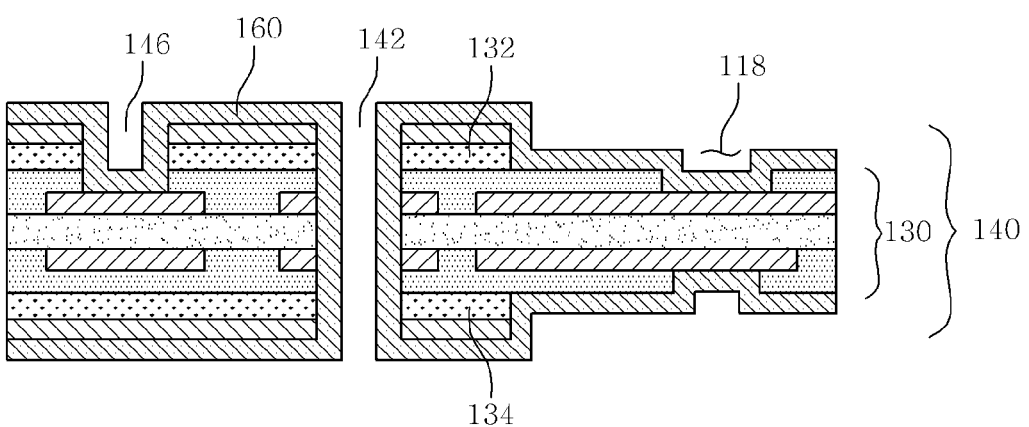
Figure 4I:
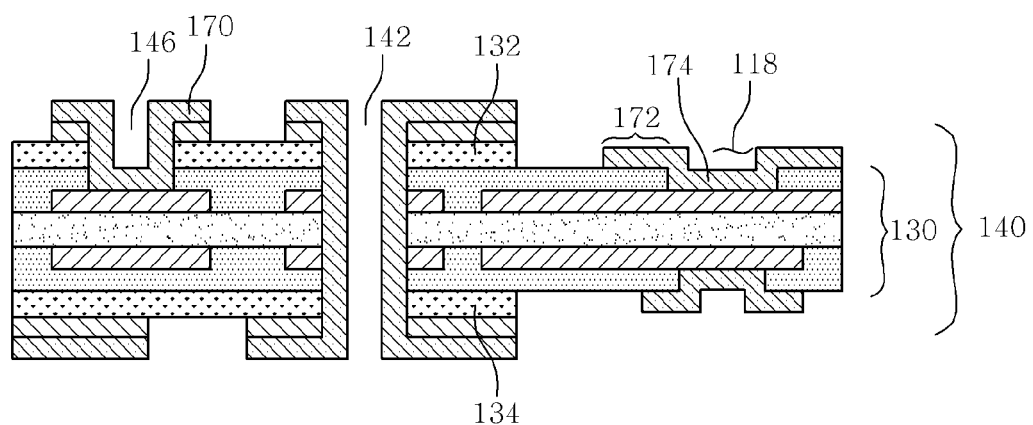

As shown in FIG. 4H, a plating layer is formed by plating the entire surface of the laminated body 140 using copper, and, as shown in FIG. 4I, outer circuit patterns 170 are formed in the rigid region using the plating layer 160, and plating layers 174 in the first windows 118 and additional plating portions 172 adjacent thereto are formed in the flexible region. That is, the plating layers 174 in the first windows 118 and the additional plating portions 172 adjacent thereto are formed in the flexible region by removing the remainder of the plating layer, other than the portions of the plating layer in the first windows 118 and adjacent to the first windows 118, from the coverlays 120 using a method of partially removing the plating layer 160.

Further, each of the additional plating portions 172 has a diameter smaller than that of the first windows 118. As described in FIG. 2, the additional plating portions 172 extend respectively from the plating layers 174 formed in the first windows 118, and are portions of the entire plating layer 160 applied on the entire surface of the laminated body 140 to form the outer circuit patterns 170.

Figure 4J:
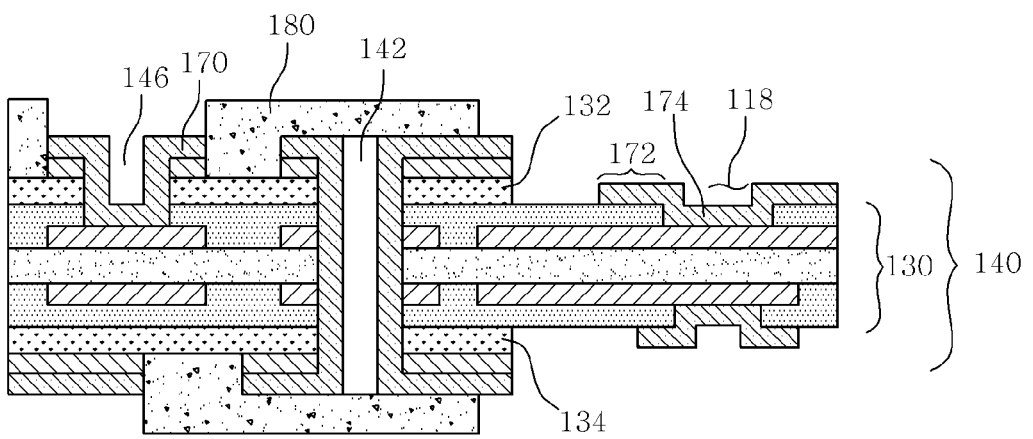
Figure 4K:
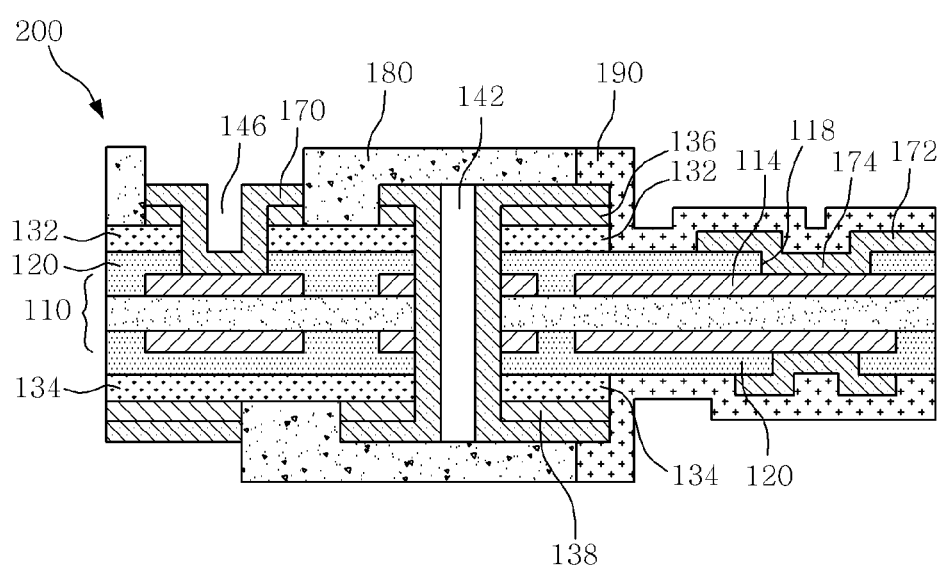

As shown in FIG. 4J, solder resists 180 are formed in the rigid region to expose portions of the outer circuit patterns 170, and, as shown in FIG. 4K, the rigid-flexible printed circuit board 200 is completed by applying conductive paste 190 to form ground shield layers on the surface of the laminated body 140 in the flexible region.

Here, if necessary, the ground shield layers may be applied or not applied.

As described above, the coverlays are respectively layered on both sides of the double-sided FCCL without previous processing thereof, the first windows are formed in the flexible region at the same time that the via hole is formed in the rigid region of the double-sided FCCL, and then the plating is performed on the laminated body, thereby decreasing the cost of processing the coverlays, and easily performing the process of provisionally layering the coverlays on the double-sided FCCL, compared to the conventional process of previously processing the coverlays and then provisionally layering them.

Further, the plating layers and the additional plating portions are formed in the flexible region, thereby decreasing the cost of applying and removing the resists, and preventing defects from occurring because the residual resist does not remain after removal of the resists, compared to the conventional process using the resists.

Figure 5:
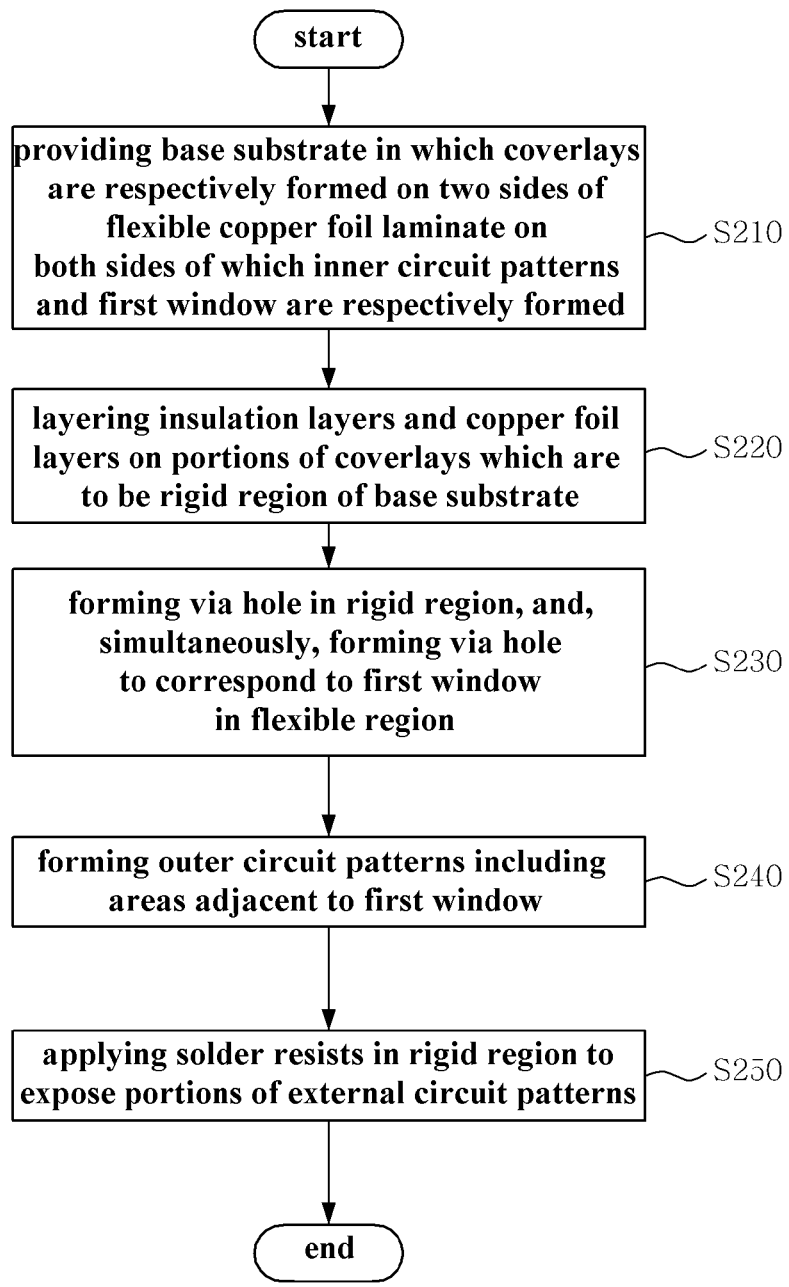
FIG. 5 is a flow chart schematically showing a method of manufacturing a rigid-flexible printed circuit board according to a second embodiment of the present invention.

FIG. 5 is a flow chart schematically showing a method of manufacturing a rigid-flexible printed circuit board according to a second embodiment of the present invention.

The method of manufacturing a rigid-flexible printed circuit board according to the second embodiment of the present invention is performed through the following steps.

First, a base substrate, in which coverlays are respectively formed on two sides of a double-sided FCCL on both sides of which inner circuit patterns and first windows are respectively formed, is provided (S210). Insulation layers and copper foil layers are layered on the portions of coverlays which are to be the rigid region of the double-sided FCCL (S220). A via hole is formed in the rigid region using a $CO_2$ laser and, simultaneously, another via hole is formed to correspond to the first window in the flexible region (S230).

An entire plating layer is formed over the entire area, and outer circuit patterns including a region around the first window are formed from the plating layer (S240). Then, solder resists are applied in the rigid region to expose a portion of the outer circuit patterns (S250).

FIG. 6A to 6I are process diagrams sequentially showing the method of manufacturing the rigid-flexible printed circuit board in FIG. 5.

The rigid-flexible printed circuit board 300 according to the second embodiment of the present invention, compared to that of the first embodiment of the present invention, is characterized in that a PTH is not formed in the rigid region, and a blind via hole and an inner via hole are formed in the flexible region.

Figure 6A:
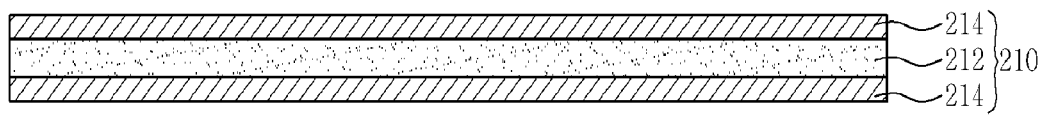
FIG. 6A to 6I are process diagrams sequentially showing the method of manufacturing the rigid-flexible printed circuit board in FIG. 5.
Figure 6B:
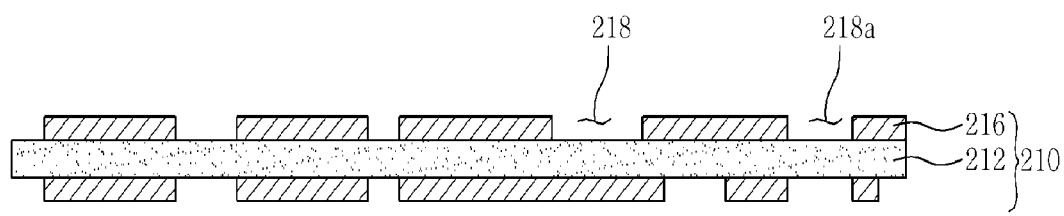

As shown in FIG. 6A, a double-sided FCCL 210, in which copper foil layers 214 are respectively formed on two sides of a polyimide film 212, is provided, and, as shown in FIG. 6B, predetermined inner circuit patterns 216, a first window 218 and third windows 218a are formed using the copper foil layers 214.

Here, the region of the double-sided FCCL 210, in which the first window 218 and the third windows 218a are formed, is a flexible region, and the region of the double-sided FCCL 210 other than the flexible region is a rigid region.

Further, a blind via hole is formed in the first window 218 later, and an inner via hole is formed in the third windows 218a later.

Figure 6C:
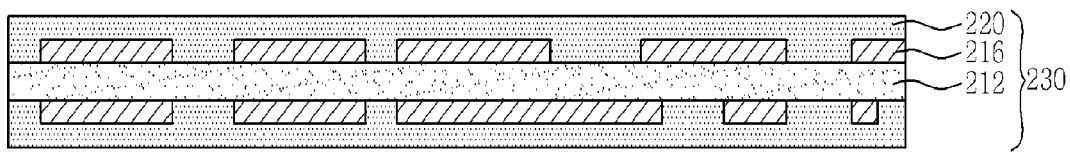

As shown in FIG. 6C, a base substrate 230 is formed by layering coverlays 220 respectively throughout two sides of the double-sided FCCL 210 on which the inner circuit patterns, the first window 218 and the third windows 218a are formed.

Here, before the coverlays are respectively layered on the double-sided FCCL, windows are not formed in the regions of the coverlays corresponding to the flexible region by previous processing, and the coverlays are directly layered on the entire surfaces of the double-sided FCCL, therefore it is not necessary to perform a process of provisionally layering the coverlays on the double-sided FCCL to conform to the circuit patterns formed on the double-sided FCCL.

Figure 6D:
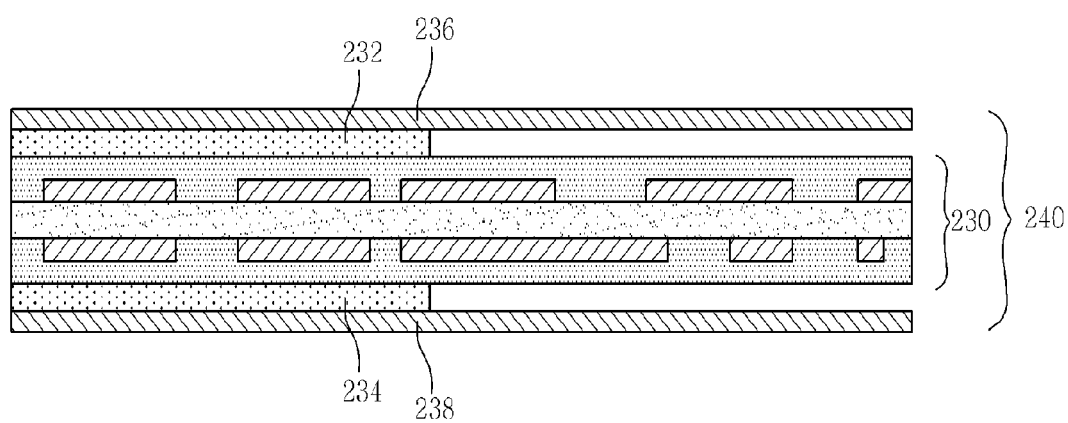

As shown in FIG. 6D, after the base substrate 230 is formed, insulation layers 232 and 234 are respectively layered on the portions of coverlays 220 which are to be a rigid region in the base substrate 230, and copper foil layers 236 and 238, having a size corresponding to that of the base substrate 230, are respectively layered on the insulation layers 232 and 234, thereby forming a laminated body 240.

Here, a prepreg, which is a mixed material of reinforcing base material and resin, may be used as each of the insulation layers 232 and 234.

Figure 6E:
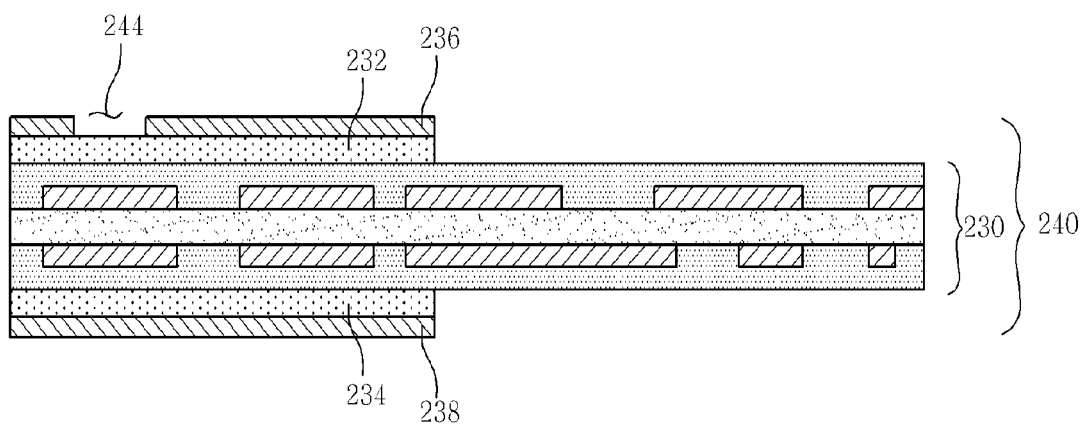

As shown in FIG. 6E, in the laminated body 240, a second window 244 is formed in a portion of the copper foil layer 236 in the rigid region, and portions of the copper foil layers 236 and 238 in the flexible region are simultaneously removed.

Figure 6F:
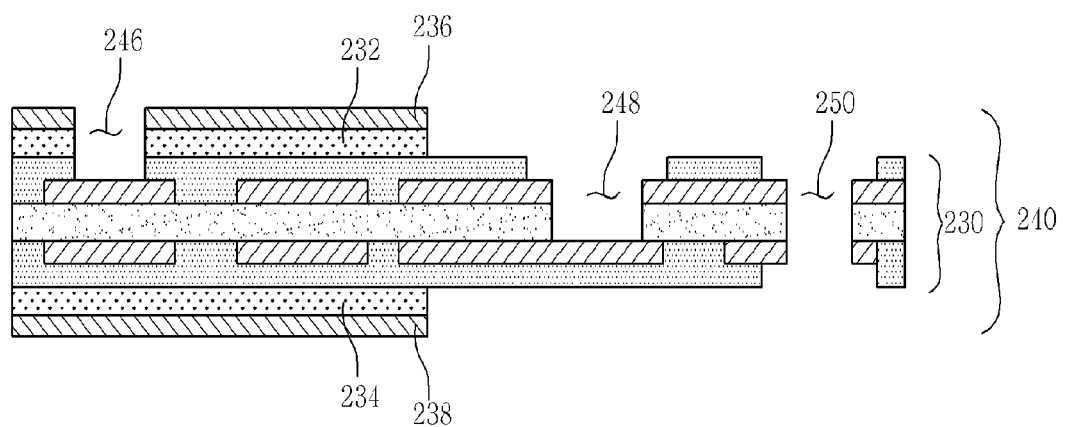

As shown in FIG. 6F, a blind via hole 246 is formed in the portion of rigid region corresponding to the second window 244 using a $CO_2$ laser, and a blind via hole 248 and an inner via hole 250 are simultaneously formed in portions of the coverlays 220 corresponding to the first window 218 and the third window 218a, respectively, using the $CO_2$ laser.

Figure 6G:
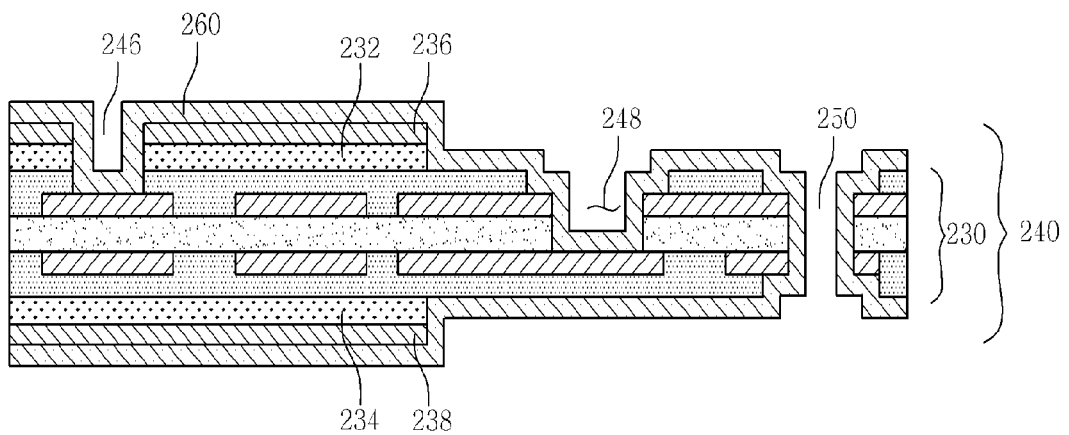
Figure 6H:
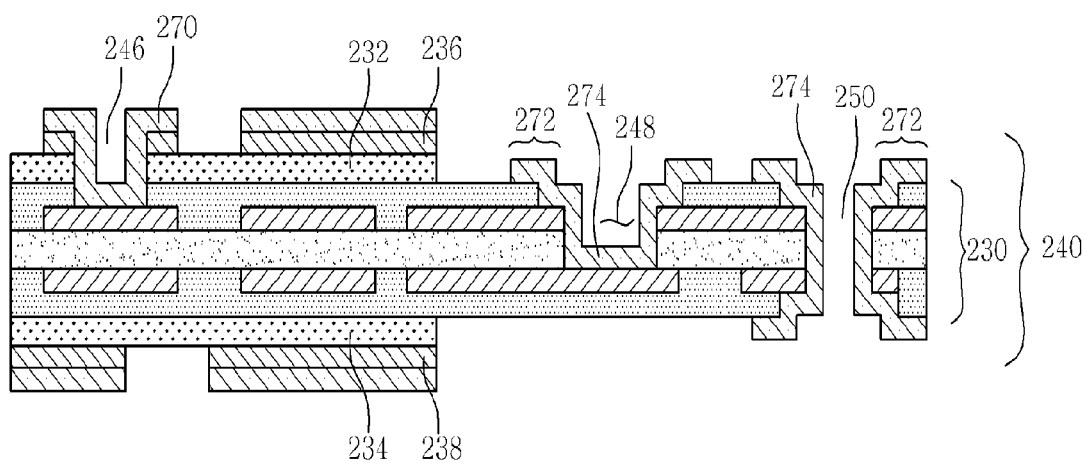

As shown in FIG. 6G, an entire plating layer 260 is formed by plating the entire surface of the laminated body 240 using copper, and, as shown in FIG. 6H, outer circuit patterns 270 are formed in the rigid region using the plating layer 260, and outer circuit patterns 270 including an additional plating portion 272 are formed in the flexible region.

Here, the plating layers 274 and the additional plating portions 272 are formed by removing the remainder of the plating layer on the coverlays 220 other than the plating layer on the coverlays 220 adjacent to the via holes 248 and 250 using the plating layer 260 plated in the flexible region.

Here, the diameters of the additional plating portions 272 are larger than the distances between the coverlays 220, and the distances between the coverlays 220 are larger than the diameters of the first windows 218. That is, it can be seen in the drawings that steps are formed from the additional plating portions into the via hole.

As described in the embodiment disclosed in FIGS. 2 to 4, the additional plating portions 274 are extended from the plating layer formed in the via holes 248 and 250 in the flexible region, and are portions of the entire plating layer 160.

Figure 6I:
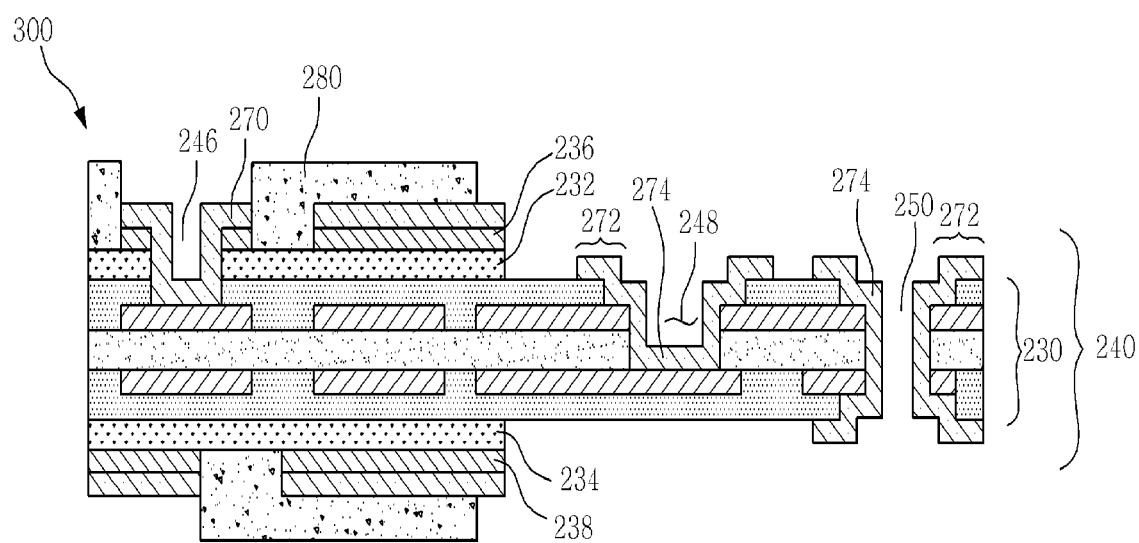

As shown in FIG. 6I, solder resists 280 are formed in the rigid region to expose portions of the outer circuit patterns 270, and thus the rigid-flexible printed circuit board 300 is completed.

Here, if necessary, the ground shield layers may applied or not applied.

As described above, the coverlays are respectively layered on both sides of the double-sided FCCL without previous processing thereof, the first windows are formed in the flexible region at the same time that the via hole is formed in the rigid region of the double-sided FCCL, and then the plating is performed on the laminated body, thereby decreasing the cost of processing the coverlays, and easily performing the process of provisionally layering the coverlays on the double-sided FCCL, compared to the conventional process of previously processing the coverlays and then provisionally layering them.

Further, the plating layers and the additional plating portions are formed in the flexible region, thereby decreasing the cost of applying and removing the resists, and preventing defects from occurring because the residual resist does not remain after removal of the resists, compared to the conventional process using the resists.

Figure 7:
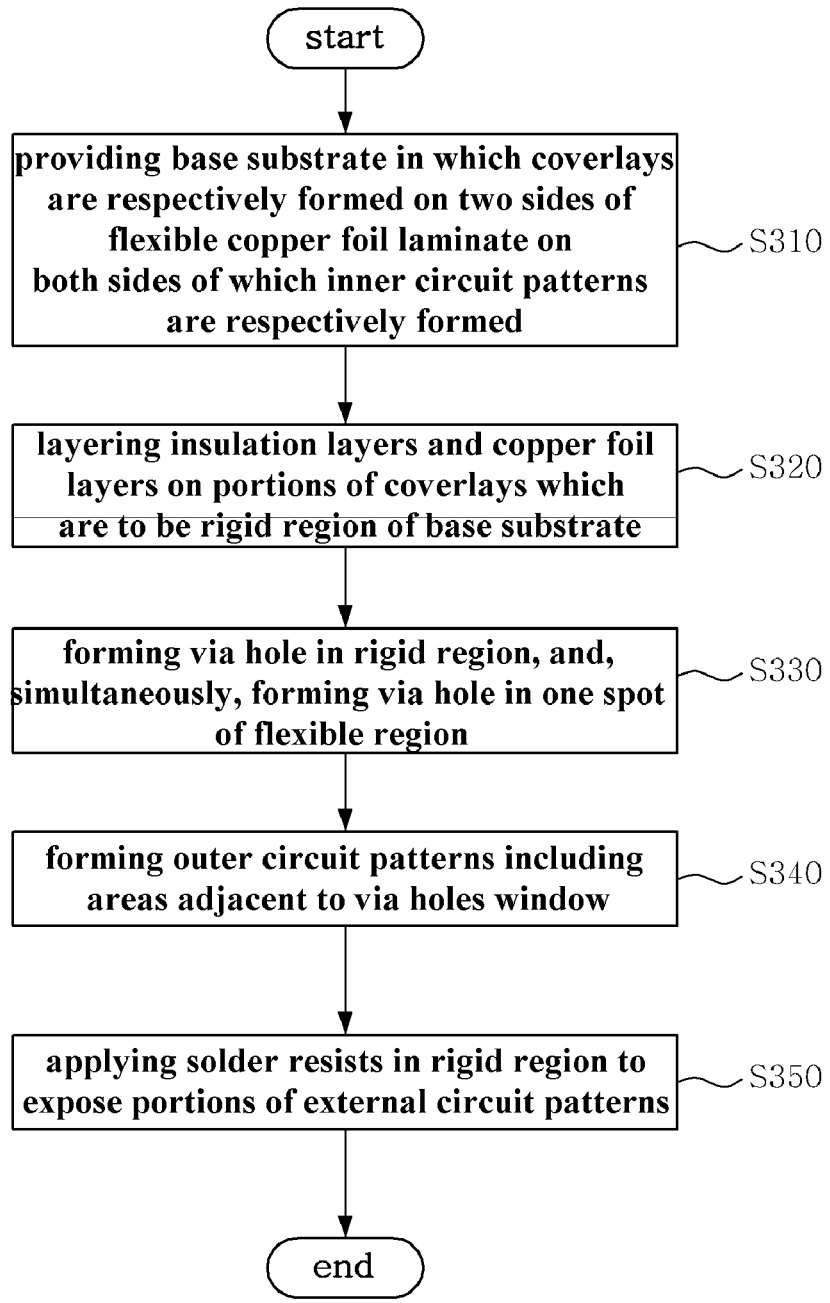
FIG. 7 is a flow chart schematically showing a method of manufacturing a rigid-flexible printed circuit board according to a third embodiment of the present invention.

FIG. 7 is a flow chart schematically showing a method of manufacturing a rigid-flexible printed circuit board according to a third embodiment of the present invention.

The method of manufacturing a rigid-flexible printed circuit board according to the third embodiment of the present invention is performed through the following steps.

First, a base substrate, in which coverlays are respectively formed on two sides of a double sided FCCL, on both sides of which inner circuit patterns and first window are formed, is provided (S310). Insulation layers and copper foil layers are respectively layered on the portions of coverlays which are to be a rigid region of the base substrate (S320). A via hole is formed in the rigid region using an ultraviolet laser, and simultaneously another via hole is formed in the flexible region (S330).

An entire plating layer is formed over the entire area, and outer circuit patterns including a region around the via holes are formed from the plating layer (S340). Then, solder resists are applied in the rigid region to expose a portion of the outer circuit patterns (S350).

FIG. 8A to 8I are process diagrams sequentially showing the method of manufacturing the rigid-flexible printed circuit board in FIG. 7.

The rigid-flexible printed circuit board 400 according to the second embodiment of the present invention, compared to that of the first embodiment of the present invention, is characterized in that a PTH is not formed in the rigid region, and a blind via hole and a inner via hole are formed in the flexible region, and, compared to that of the second embodiment of the present invention, is characterized in that the blind via hole and inner via hole formed in the flexible region are formed to be perpendicular to the lower copper foil layer of a double-sided FCCL.

Figure 8A:
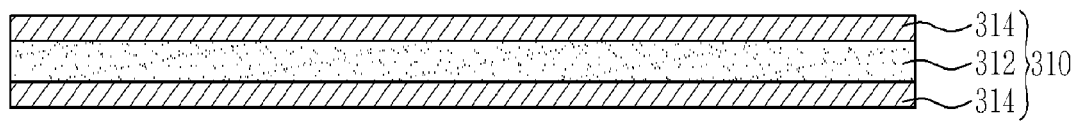
FIG. 8A to 8I are process diagrams sequentially showing the method of manufacturing the rigid-flexible printed circuit board in FIG. 7.
Figure 8B:
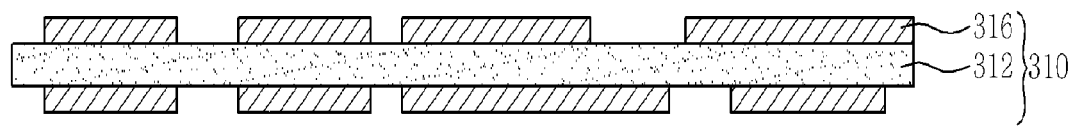

As shown in FIG. 8A, a double-sided FCCL 310, in which copper foil layers 314 are respectively formed on two sides of a polyimide film 312, is provided, and, as shown in FIG. 8B, predetermined inner circuit patterns 316 are formed using the copper foil layers 314.

Figure 8C:
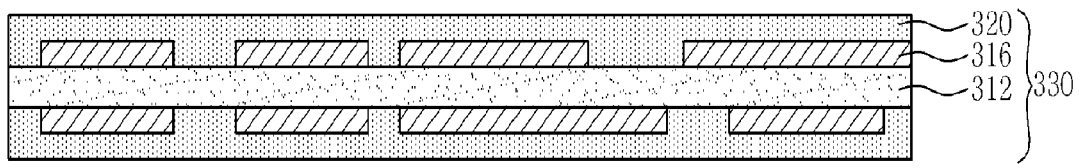

As shown in FIG. 8C, a base substrate 330 is formed by layering coverlays 320 over all of two sides of the double-sided FCCL 310 on which the inner circuit patterns 316 are formed.

Here, before the coverlays are respectively layered on the double-sided FCCL, windows are not formed in the regions of the coverlays corresponding to the flexible region by previous processing, and the coverlays are directly layered on the entire surfaces of the double-sided FCCL, therefore it is not necessary to perform a process of provisionally layering the coverlays on the double-sided FCCL to conform to the circuit patterns formed on the double-sided FCCL.

Figure 8D:
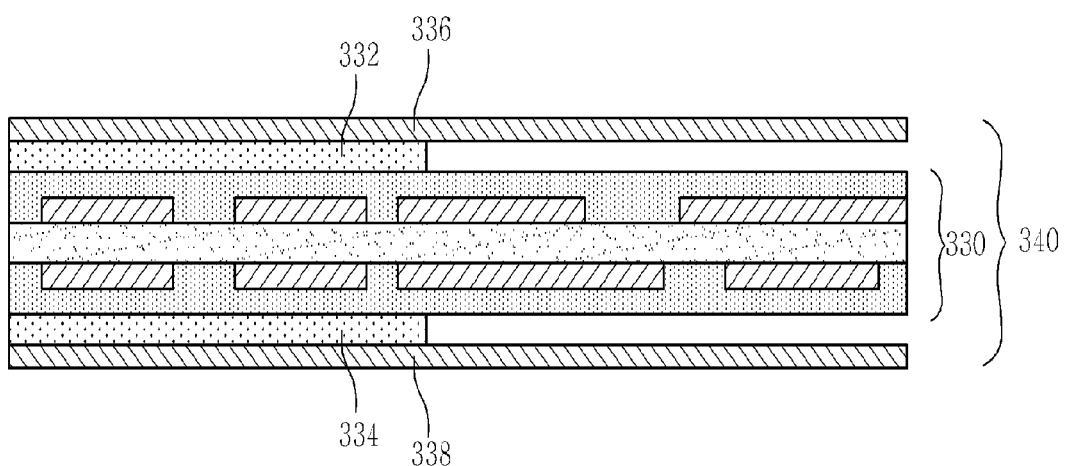

As shown in FIG. 8D, after the base substrate 330 is formed, insulation layers 332 and 334 are respectively layered on the portions of coverlays 320 which are to be a rigid region of the base substrate 330, and copper foil layers 336 and 338, having the size corresponding to that of the base substrate 330, are respectively layered on the insulation layers 332 and 334, thereby forming a laminated body 340.

Here, a prepreg, which is a mixed material of reinforcing base material and resin and is cured after it has been heated and pressurized in a semi-cured state, may be used as each of the insulation layers 332 and 334.

Figure 8E:
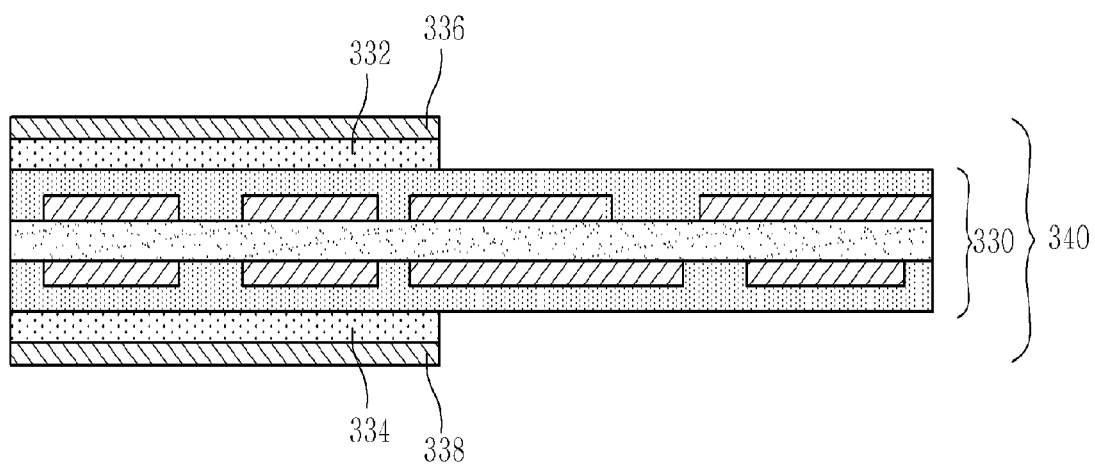

As shown in FIG. 8E, the copper foil layers 336 and 338 in the flexible region are etched and thus removed.

Figure 8F:
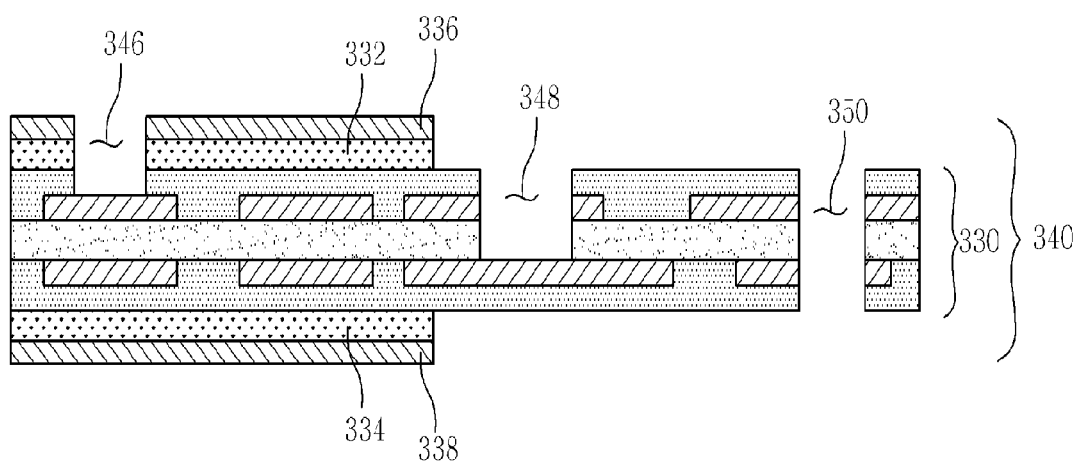

As shown in FIG. 8F, a blind via hole 346 is formed in the portion of rigid region using an ultraviolet laser, and a blind via hole 348 and an inner via hole 350 are simultaneously formed in the portions of the flexible region using the ultraviolet laser.

Figure 8G:
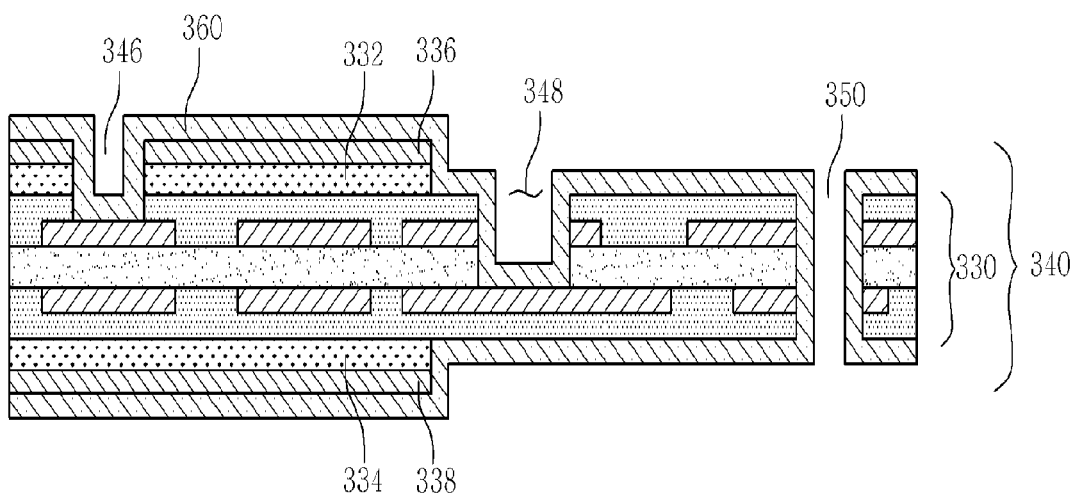
Figure 8H:
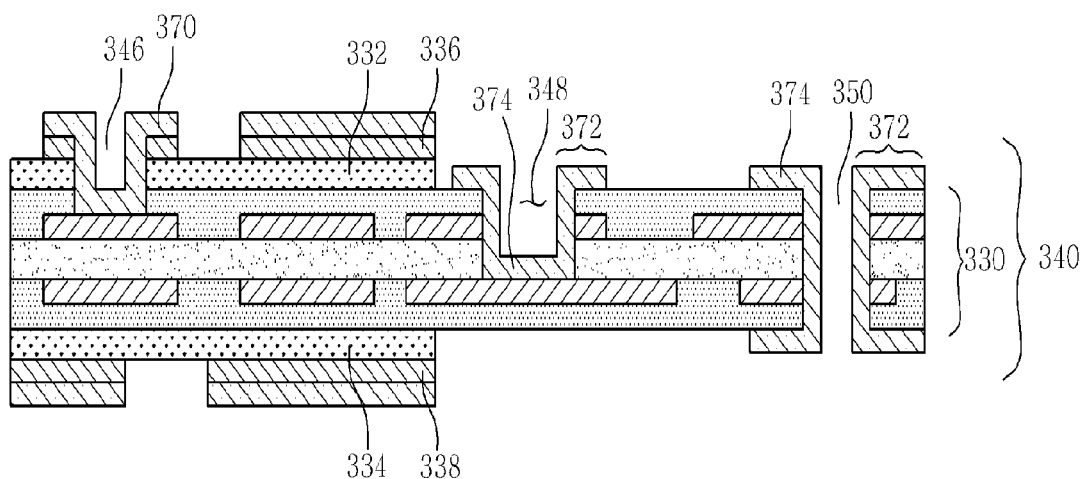

As shown in FIG. 8G, an entire plating layer 360 is formed by plating the entire surface of the laminated body 340 using copper, and, as shown in FIG. 8H, outer circuit patterns 370 are formed in the rigid region using the plating layer 360, and outer circuit patterns 370 including plating layers 374 for the via holes 348 and 350 and additional plating portions 372 adjacent thereto are formed in the flexible region.

That is, the additional plating portions 372 and the via holes 348 and 350 are formed by removing the remainder of the plating layer on the coverlays 320 other than the plating layer adjacent to the via holes 348 and 350 using the method of partially removing the plating layer 360 plated in the flexible region.

Here, the diameters of the additional plating portions 372 are smaller than the diameters of the via holes 348 or 350.

Figure 8I:
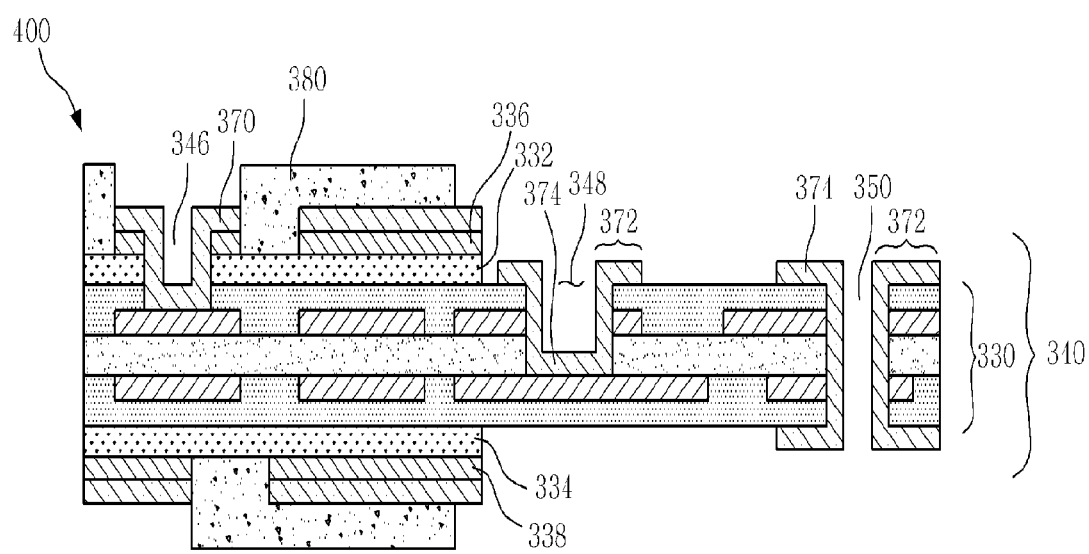

As shown in FIG. 8I, solder resists 380 are formed in the rigid region to expose portions of the outer circuit patterns 370, and thus the rigid-flexible printed circuit board 400 is completed.

Here, if necessary, the ground shield layers may be applied or not applied.

As described above, the coverlays are respectively layered on both sides of the double-sided FCCL without previous processing thereof, the first windows are formed in the flexible region at the same time that the via hole is formed in the rigid region of the double-sided FCCL, and then the plating is performed on the laminated body, thereby decreasing the cost of processing the coverlays, and easily performing the process of provisionally layering the coverlays on the double-sided FCCL, compared to the conventional process of previously processing the coverlays and then provisionally layering them.

Further, the plating layers and the additional plating portions are formed in the flexible region, thereby decreasing the cost of applying and removing the resists, and preventing defects from occurring because the residual resist does not remain after removal of the resists, compared to the conventional process using the resists.

Accordingly, the coverlays are layered on the entire surface of the double-sided FCCL without previous processing thereof, the via holes are formed in the coverlays while a drilling process is performed to form the via holes, and then the copper plating is entirely performed, thereby eliminating the cost of previously processing the coverlays, easily performing a process of provisionally layering the coverlays on the double-sided FCCL, and decreasing the cost therefor.

According to the rigid-flexible printed circuit board of the present invention, since the coverlays are layered on the entire surface of the double-sided FCCL without previous processing thereof, the via holes are formed in the coverlays while a drilling process is performed to form the via holes, and then the copper plating is entirely performed, it is possible to decrease the cost of previously processing the coverlays, easily perform a process of provisionally layering the coverlays on the double-sided FCCL, and decrease the cost therefor.

Further, since the plating layer is formed in the flexible region, it is possible to decrease the cost of applying and removing the resists and prevent defective products from occurring because residual resist does not remain after removal of the resist.

What is claimed is:

1. A method of manufacturing a rigid-flexible printed circuit board, comprising:
   providing a base substrate in which coverlays are respectively formed on two sides of a flexible copper foil laminate on both sides of which inner circuit patterns are respectively formed;
   layering insulation layers and copper foil layers on portions of coverlays which are to be a rigid region of the flexible copper foil laminate;
   forming a via hole in the rigid region, and, simultaneously, forming first windows in the coverlays in a flexible region;
   forming outer circuit patterns including areas adjacent to the first windows; and
   applying solder resist in the rigid region to expose portions of the external circuit patterns,
   wherein the outer circuit patterns formed in the areas adjacent to the first windows include additional plating portions for covering portions of the coverlays.

2. The method as set forth in claim 1, wherein the via hole formed in the rigid region and the first windows formed in the flexible region are formed using a $CO_2$ laser.

3. The method as set forth in claim 1, further comprising, after layering the insulation layers and copper foil layers on portions of the coverlays:
   forming a through hole in the rigid region through a drilling process; and
   forming a second window in the cooper foil layer in the rigid region.

4. The method as set forth in claim 3, wherein further comprising forming a blind via hole in the rigid region to correspond to the second window.

5. The method as set forth in claim 1, further comprising, after applying the solder resist in the rigid region to expose portions of the external circuit patterns:
   applying conductive paste to form ground shield layers on outer sides of the flexible region.

* * * * *